(12) United States Patent
Hoefel et al.

(10) Patent No.: US 12,704,550 B2
(45) Date of Patent: Aug. 11, 2026

(54) ISOLATION SYSTEM AND METHOD FOR WELL SITE APPLICATIONS

(71) Applicant: Sensia Netherlands B.V., Rotterdam (NL)

(72) Inventors: Albert Hoefel, Sugar Land, TX (US); Jeffery Anderson, Beaumont (CA); Tengyun Chu, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 306 days.

(21) Appl. No.: 18/517,986

(22) Filed: Nov. 22, 2023

(65) Prior Publication Data

US 2025/0164559 A1 May 22, 2025

(51) Int. Cl.

*G01R 31/34* (2020.01)
*E21B 41/00* (2006.01)
*G01R 1/36* (2006.01)
*G01R 19/25* (2006.01)
*G01R 19/252* (2006.01)

(52) U.S. Cl.

CPC ........ *G01R 31/343* (2013.01); *E21B 41/0085* (2013.01); *G01R 1/36* (2013.01); *G01R 19/2513* (2013.01); *G01R 19/252* (2013.01)

(58) Field of Classification Search

CPC .... G01R 31/343; G01R 1/36; G01R 19/2513; G01R 19/252; G01R 15/142; E21B 41/0085; E21B 47/008; E21B 43/128; H02P 29/02; F04B 49/06

USPC ............................ 324/765.01, 119, 126, 127

See application file for complete search history.

(56) References Cited

U.S. PATENT DOCUMENTS

2012/0265190 A1* 10/2012 Curley ................. A61B 18/082 29/600
2015/0167466 A1 6/2015 Teodorescu et al.
2017/0002641 A1 1/2017 Dykstra et al.
2017/0045055 A1 2/2017 Hoefel et al.

(Continued)

FOREIGN PATENT DOCUMENTS

CN 106068458 A * 11/2016 ........... G01R 31/005
EP 4 026 984 A1 7/2022
EP 4 206 437 A1 7/2023

OTHER PUBLICATIONS

SeaLevel, What is optical isolation and why is it beneficial?, available at https://www.sealevel.com/what-is-optical-isolation-and-why-is-it-beneficial?srsltid=AfmBOor_1KATwAO7Qr-7xFNu9fBIER5ASNGiYVgwjKbDnF0jzhOBjkyz (published Jun. 27, 2023; last accessed Nov. 14, 2025) (Year: 2023).*

(Continued)

*Primary Examiner* — Arleen M Vazquez
*Assistant Examiner* — Robert P Alejnikov, Jr.
(74) *Attorney, Agent, or Firm* — FOLEY & LARDNER LLP

(57) ABSTRACT

Systems and methods provided herein relate to a power system, such as a system for a motor. A digital acquisition unit is configured to receive current sense signals associated with a motor and phase voltage power signals associate the motor. The data acquisition unit includes a module coupled to a first ground and an attenuator circuit coupled to a second ground. The first ground is isolated from the second ground. The phase voltage power signals are provided to the attenuator, and the attenuator provides phase voltage sense signals to the module.

17 Claims, 5 Drawing Sheets

(56) References Cited

U.S. PATENT DOCUMENTS

| | | | | |
|---|---|---|---|---|
| 2017/0058653 | A1* | 3/2017 | Gupta | E21B 43/128 |
| 2017/0089192 | A1 | 3/2017 | Rendusara et al. | |
| 2018/0087359 | A1 | 3/2018 | Conn et al. | |
| 2018/0209252 | A1* | 7/2018 | Shanks | E21B 43/128 |
| 2020/0132882 | A1 | 4/2020 | Runkana et al. | |
| 2020/0355189 | A1 | 11/2020 | Hoefel et al. | |
| 2022/0018231 | A1 | 1/2022 | Weatherhead et al. | |
| 2022/0154889 | A1 | 5/2022 | Otto | |
| 2022/0170353 | A1 | 6/2022 | Chong et al. | |
| 2022/0180019 | A1 | 6/2022 | Chong et al. | |
| 2023/0184071 | A1 | 6/2023 | Janger et al. | |
| 2023/0361645 | A1 | 11/2023 | Selvaraj et al. | |

OTHER PUBLICATIONS

M. Grubmüller, B. Schweighofer and H. Wegleiter, “A Digital Isolated High Voltage Probe for Measurements in Power Electronics,” 2018 IEEE 27th International Symposium on Industrial Electronics (ISIE), Cairns, QLD, Australia, 2018, pp. 791-796, doi: 10.1109/ISIE.2018.8433652 (Year: 2018).*

European Search Report dated Apr. 29, 2025. in Application No. 24214098.6.

International Preliminary Report on Patentability on Appl. No. PCT/US2024/032945 dated Sep. 4, 2025.

International Search and Written Opinion of the International Searching Report on Appl. No. PCT/US2025/032423 dated Sep. 17, 2025.

Alighanbari et al, “Deep Reinforcement Learning With NMPC Assistance Nash Switching for Urban Autonomous Driving,” 2022, IEEE Transactions on Intelligent Vehicles, vol. 8, Issue 3, pp. 1-12.

Hoon, O., “Q-MPC: stable and efficient reinforcement learning using model predictive control,” 2023, IFAC PapersOnLine, vol. 56, Issue 2, pp. 2727-2732.

International Search Report and Written Opinion on PCT/US2024/032945 dated Sep. 24, 2024.

Jones et al., “Characterising the Digital Twin: A systematic literature review, CIRP Journal of Manufacturing Science and Technology,” May 2020, vol. 29, Part A, (pp. 36-52).

Maddox et al., “Fast Adaptation with Linearized Neural Networks,” Proceedings of the 24th International Conference on Artificial Intelligence and Statistics (AISTATS) 2021, San Diego, California, USA. PMLR: vol. 130 (11 Pages).

O,Neill, “How Zoox robotaxi predicts everything, everywhere, all at once,” Amazon.science, Aug. 9, 2022 https://www.amazon.science/latest-news/how-the-zoox-robotaxi-predicts-everything-everywhere-all-at-once [procure from the internet Jun. 13, 2024] (10 pages).

Srouji et al., “Safe Real-World Reinforcement Learning for Mobile Agent Obstacle Avoidance,” Apple Machine Learning Research, Oct. 2022 (7 pages).

EP Search Report on Appl. No. 24214098.6 dated Apr. 29, 2025.

* cited by examiner

ISOLATION SYSTEM AND METHOD FOR WELL SITE APPLICATIONS

BACKGROUND

The present application relates generally to monitoring and/or controlling equipment at a well site.

Various types of electrical equipment can be utilized at a well site (e.g., oil field). As an example, a pump system can be utilized to move fluid in a well in a subterranean or surface environment. Pump systems can include but are not limited to down hole pumps, submersible pumps, horse head pumps, jet pumps, centrifugal pumps, reciprocating plunger pumps, progressive cavity pumps, gear pumps, diaphragm pumps, metering pumps, etc. Voltage sensors and transducers can be utilized to sense conditions associated with pump systems. However, isolation requirements associated with monitoring such conditions require expensive components. For example, some conventional systems use special step-down power transformers for measurement isolation, or transformer isolated hall effect sensors for low voltage drive signal acquisition on the primary side of the main power transformer.

SUMMARY

One implementation of the present disclosure relates to a pump system for a well site. The pump system includes a data acquisition unit configured to receive current sense signals associated with a motor and phase voltage and current signals associated the motor. The data acquisition unit includes a first side referenced to a first ground and an attenuator circuit referenced to a second ground. The first ground is isolated from the second ground. The phase voltage power signals are provided to the attenuator circuit, and the attenuator circuit provides phase voltage sense signals.

In some embodiments, the system also include isolated power sources referenced to the first ground and second grounds configured to provide separated power to the module on each side. In some embodiments, the an isolated power source referenced to the second ground can be used to provide power to the electronics on the attenuator side.

In some embodiments, the attenuator includes an impedance network, and the phase voltage power signals are provided to the impedance network. In some embodiments, the attenuator includes an amplifier coupled to the impedance network. The amplifier is coupled to an analog to digital converter in the module. In some embodiments, the module includes an isolation circuit between a controller and the analog to digital converter. In some embodiments, the system also includes current sensors configured to provide the current phase sense signals.

Some embodiments relate to pump system for a well site. The pump system includes a data acquisition unit configured to receive current sense signals associated with a motor and phase voltage power sense signals associated the motor. The data acquisition unit comprising an isolation circuit having a first side referenced to a first ground and a second side coupled to an attenuator circuit and referenced to a second ground, wherein the first ground is isolated from the second ground, wherein phase voltage power signals are provided to the attenuator circuit and wherein the attenuator circuit provides phase voltage sense signals. The term side as used herein may refer to an electrical side and not necessarily a mechanical side in some embodiments. The side may refer to an electrical side of an isolation circuit.

Some embodiments relate to a digital acquisition unit for high voltage applications. The unit includes a first analog to digital converter configured to receive current sense signals associated phase voltage power signals. The first converter is coupled to a first ground, in some embodiments a single analog to digital converter handles both voltage and currents. The unit also can include a second analog to digital converter configured to receive voltage sense signals. The second converter is also coupled to the first ground. The unit also includes an attenuator circuit coupled to a first ground on the analog side. The first ground is isolated from the second ground and the phase voltage power signals are provided to the attenuator circuit. The attenuator circuit provides phase voltage sense signals to the first analog to digital converter. The ADC digital interface signals are coupled by an isolated interface to the second ground.

In some embodiments, the digital acquisition unit also includes a separate isolated power source coupled to the first ground and configured to provide first power to the first analog to digital converter. In some embodiments, a first power source is coupled to the second ground and configured to provide power to the side attenuator of the circuit.

In some embodiments, the digital acquisition unit also includes an isolation circuit between the second analog to digital converter and a controller. In some embodiments, the attenuator circuit includes an impedance network, and the phase voltage power signals are provided to the impedance network. In some embodiments, the attenuator circuit includes the attenuator circuit including an amplifier coupled to an impedance network. The amplifier is coupled to the second analog to digital converter. In some embodiments, the digital acquisition unit also includes current sensors configured to provide the current sense signals.

Some embodiments relate to a method of providing measurements to a controller. The method includes receiving current sense signals associated with a motor by a data acquisition unit, and receiving phase voltage sense signals associated with phase voltage power signals for the motor by the data acquisition module. The ADC analog input is coupled to a first ground as well as the attenuator circuit. The first ground is isolated from the second ground. The phase voltage power signals are provided to the attenuator circuit and the attenuator circuit provides the phase voltage sense signals to the ADC.

In some embodiments, the method also includes powering the module using an isolated power source coupled to the first ground and configured to provide first power to the module. In some embodiments, the method also powering the attenuator side circuit using a first power source coupled to the second ground and configured to provide second power to the attenuator circuit. In some embodiments, the attenuator circuit includes an amplifier coupled to an impedance network. The amplifier is coupled to an analog to digital converter in the module in some embodiments.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

The present disclosure relates to pump systems, including, but not limited to, downhole pump systems, reciprocating pump systems, such as sucker rod pump systems, submersible pump systems, electric motors on a well site and other electrical systems. Systems and methods are used to isolate higher power or higher voltage systems from lower power or lower voltage systems without bulky and expensive isolation components in some embodiments. In some embodiments, isolation is achieved for measuring and/or data acquisition devices. In some embodiments, the systems and methods avoid potentially destructive saturation effect on coupling transformers with direct current (DC) contents and/or high voltage to frequency (volts/hertz (V/Hz)) ratios. In some embodiments, data acquisition uses attenuators on the secondary high voltage side. The digital side of the data acquisition unit is not affected by the voltage attenuation or by the transformer magnetization currents. The systems and methods allow better assessment of developing cable or motor leakage to ground through the zero-sequence voltage for quantified symmetry to ground (e.g., earth) of the phase voltages.

In some embodiments, the systems and methods of isolation allow more types of measurements and more precise measurements with less cost and no saturation risk related to high V/Hz ratios or DC contents. An apparatus provides a cost-effective solution for proper high voltage insulation with no or little performance degradation on the analog acquisition.

Figure 1:
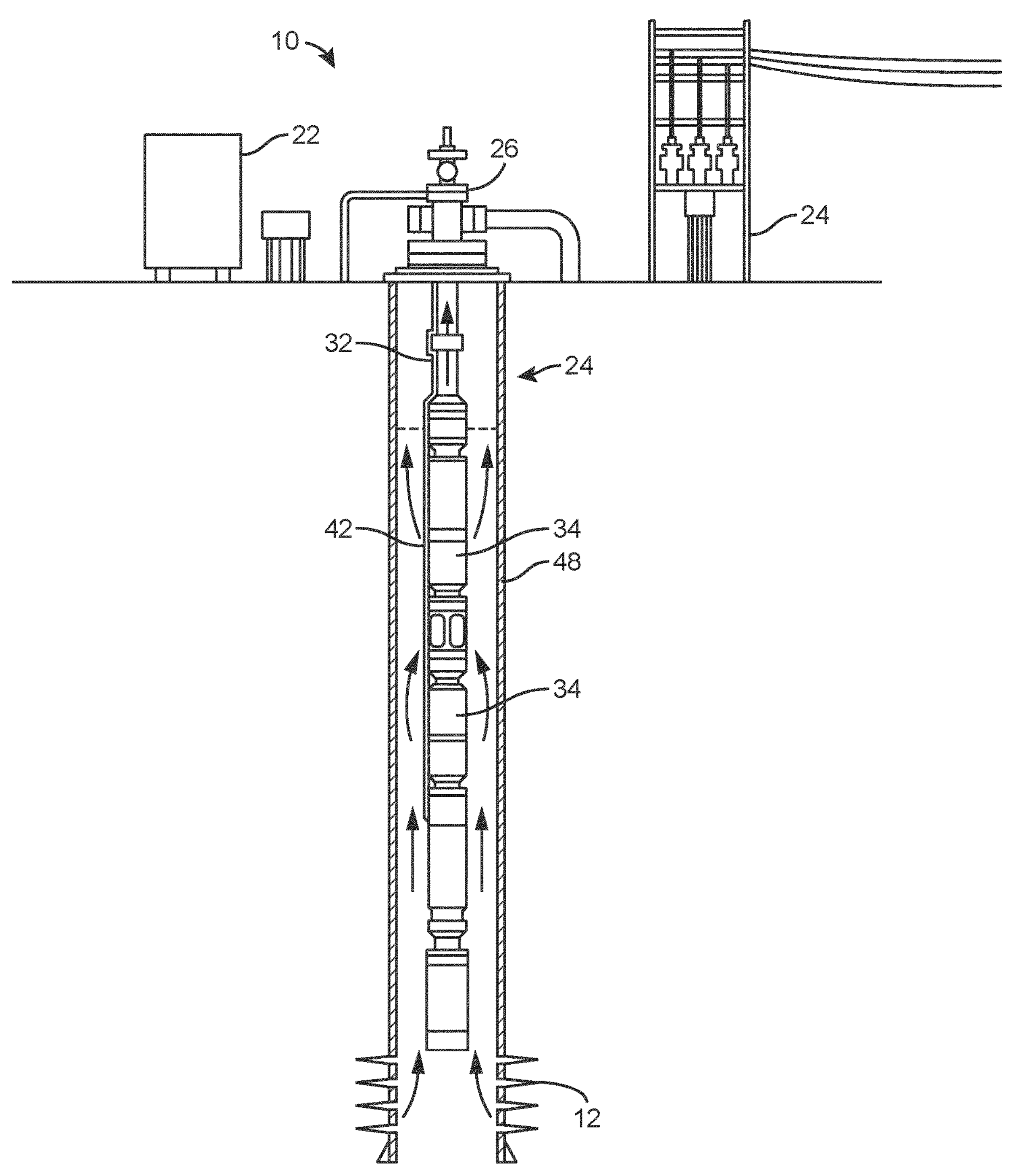
FIG. 1 is a schematic diagram of a well site that includes a pump, according to some embodiments.

With reference to FIG. 1, a well site 10 includes a pump 20, a controller 22, electrical transformers 24, and a well head 26. Produced fluids 12 are pumped by pump 20 to well head 26. Pump 20 can be one or more electrical submersible pumps (ESPs), each including an electric motor controlled by a variable speed drive in controller 22. The variable speed drive adjusts output of pump 20 by controlling the speed of the electric motor via signals to the armature, rotor/stator, or other winding of the motor. The motors are two pole, three phase induction motors in some embodiments. Controller 22 can also include a user interface or a computer to provide various settings for well site operations. Although shown as a subsurface pump, pump 20 can be any type of pump or motor system in some embodiments.

Electrical transformers 24 provide power (e.g., electric voltage and current for the variable speed drive). Controller 22 includes circuits and components that can protect components of well site 10 by shutting off power if normal operating limits are not maintained. Power cables 32 supply the electric signals to one or more motors through armor protected, insulated conductors. Power cables 32 are round except for a flat section along the one or more ESPS and motor protectors where space is limited in some embodiments. In some embodiments, the motor protectors connect pump 20 to motor and isolate the motor from produced fluids and other well fluids. The motor protectors serve as an oil reservoir and equalize pressure between the well bore and the well casing or tubing casing annulus 48 and allow expansion and/or contraction of motor oil in some embodiments.

Pump housing 34 for pump 20 includes multi-stage rotating impellers and stationary diffusers in some embodiments. The number of stages (e.g., centrifugal stages) is related to the rate, pressure and required power and can be any number from 1 to n depending on design criteria and well site parameters. Gas separators 42 can be employed to segregate some free gas from produced fluids into the tubing casing annulus 48 by fluid reversal or rotary centrifuge before gas enters pump 20. Intakes to pump 20 allow fluids to enter the pump 20 and may be part of a gas separator 42. In some embodiments, the well site 10 is for a cased well or an open well. For example, a partially cased well may include an open well portion or portions. An annular space may exist between an outer surface of tubing casing annulus 48 and the pump 20.

Figure 2:
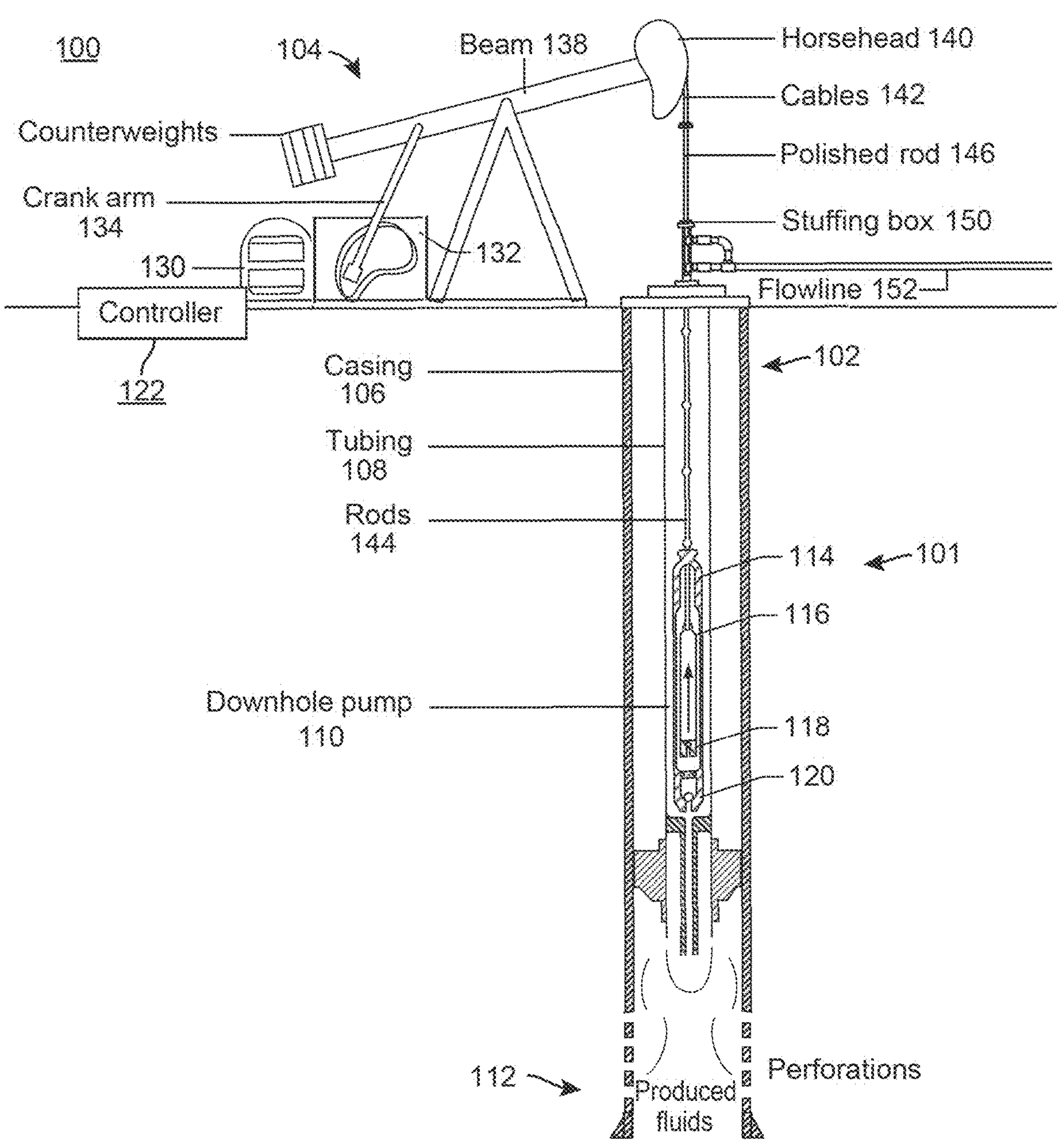
FIG. 2 is a schematic diagram of a system that includes a pump disposed in a subterranean environment, according to some embodiments.

Referring now to FIG. 2, a pump system 100 is shown, according to some embodiments. Pump system 100 can be utilized on well site 10 (FIG. 1). The system 100 includes a pump assembly 101 as driven by a pump drive system 104 that is operatively coupled to a controller 122. For example, the pump assembly 101 and drive system 104 may be arranged as a beam pump. In some embodiments, the system 100 further includes a walking beam 138 that reciprocates a rod string 144. The rod string 144 may include a polished rod portion 146 that can move in a bore of a stuffing box 150 of a well head assembly that includes a discharge port in fluid communication with a flowline 152. The rod string 144 may be suspended from the walking beam 138 via one or more cables 142 hung from a horse head 140 for actuating a downhole pump 110 of the pump assembly 101 where the downhole pump 110 is positioned in a well 102. For example, the well 102 may be in a subterranean environment, and the downhole pump 110 may be positioned near a bottom 112 of the well 102.

In some embodiments, the well 102 may be a cased well or an open well. For example, a partially cased well may include an open well portion or portions. As shown in FIG. 2, the well 102 includes casing 106 that defines a cased bore where tubing 108 is disposed in the cased bore. An annular space may exist between an outer surface of the tubing 108 and an inner surface of the casing 106.

In some embodiments, the walking beam 138 is actuated by a pitman arm (or pitman arms), which is reciprocated by a crank arm (or crank arms) 134 driven by a prime mover 130 (e.g., electric motor, etc.). For example, the prime mover 130 may be coupled to the crank arm 134 through a gear reduction mechanism, such as gears of a gearbox 132. In some cases, the prime mover 130 is a three-phase AC induction motor that can be controlled via circuitry of the controller 122, which may be connected to a power supply. The gearbox 132 of the pump drive system 104 may convert electric motor torque to a low speed, high torque output for driving the crank arm 134. The crank arm 134 may be operatively coupled to one or more counterweights that serve to balance the rod string 144 and other equipment as suspended from the horse head 140 of the walking beam 138. A counterbalance may be provided by an air cylinder such as those found on air-balanced units.

In some embodiments, the downhole pump 110 is a reciprocating type of pump that includes a plunger 116 attached to an end of the rod string 144 and a pump barrel 114, which may be attached to an end of the tubing 108 in the well 102. The plunger 116 can include a traveling valve 118 and a standing valve 120 positioned at or near a bottom of the pump barrel 114. During operation, for an up stroke where the rod string 144 translates upwardly, the traveling valve 118 can close and lift fluid (e.g., oil, water, etc.) above the plunger 116 to a top of the well 102 and the standing valve 120 can open to allow additional fluid from a reservoir to flow into the pump barrel 114. As to a down stroke where the rod string 144 translates downwardly, the traveling valve 118 can open and the standing valve 120 can close to prepare for a subsequent cycle. Operation of the downhole pump 110 may be controlled such that a fluid level is maintained in the pump barrel 114 where the fluid level can be sufficient to maintain the lower end of the rod string 144 in the fluid over its entire stroke.

As an example, the prime mover can be an electric motor that provides power to the pumping unit. As an example, a prime mover can deliver highspeed, low-torque power to a gear reducer, which converts that energy into the low-speed, high-torque energy utilized by the surface pump. As shown in FIG. 2, a beam pumping unit, beam pump system or merely beam pump, converts the rotational motion of the prime mover into a reciprocating vertical motion that lifts and lowers a rod string connected to a subsurface pump.

Figure 3:
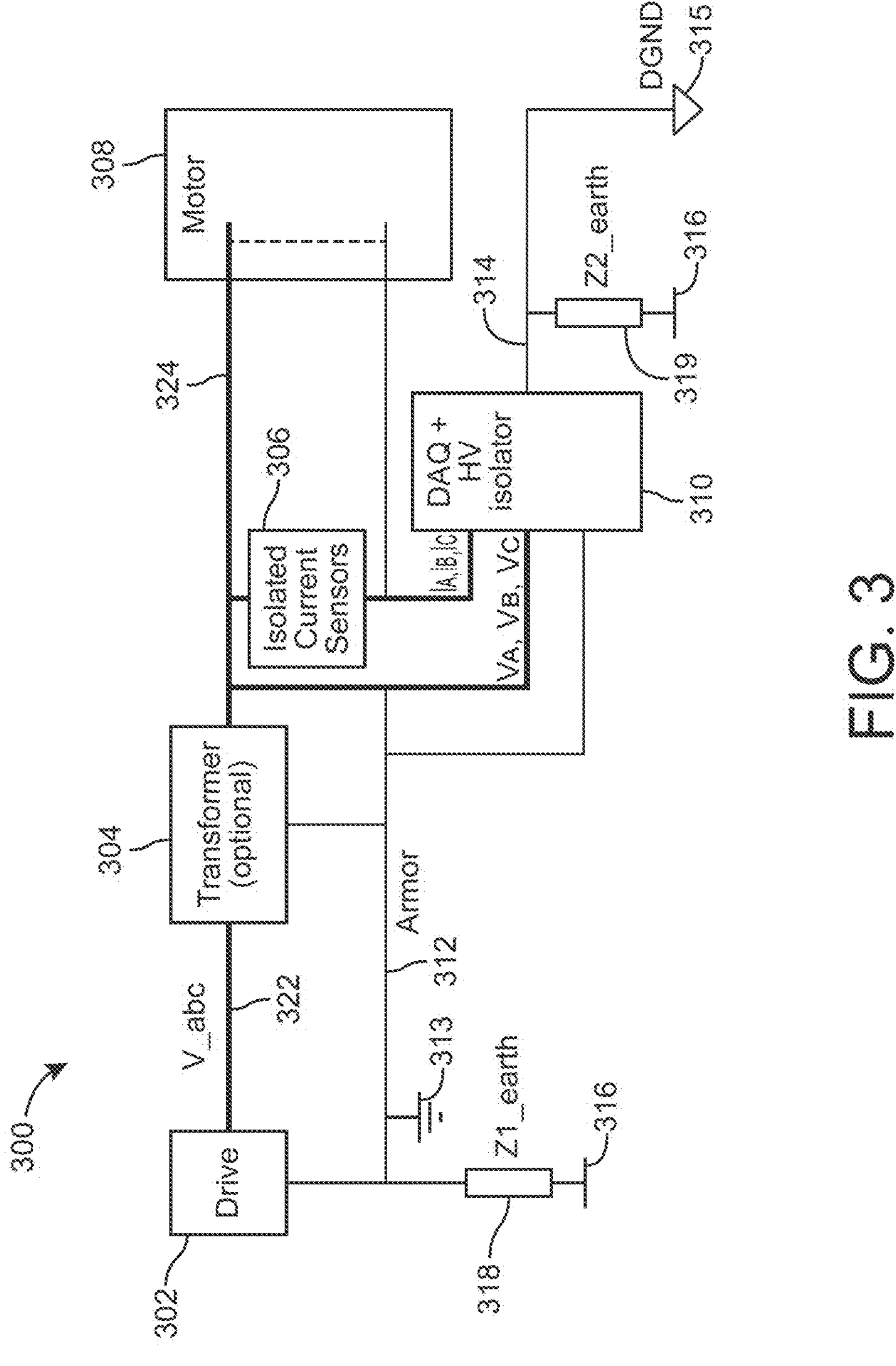
FIG. 3 is a schematic diagram of an isolation system coupled to sensors, a motor, and a drive which can be used at the well site illustrated in FIG. 1 and/or in the system illustrated in FIG. 2, according to some embodiments.

With reference to FIG. 3, a system 300 can be part of well site 10 (FIG. 1) or pumping system 100. Although system 300 is particularly advantageous when used with subsurface motors for pumps where sensor disposition is more difficult, system 300 can be used with motors disposed above surface, such as, in system 100. System 300 can be employed at various petroleum processing systems, mines, industrial systems, etc. In some embodiments, system 300 is used with water pumps, geothermal power generation and heating, etc. Downhole pumps in water industry, waste industry, mine dewatering, geothermal plants, etc. can be used with system 300.

System 300 includes an electrical drive 302, a transformer 304, a current sensor system 306, a motor 308, and a data acquisition system 310. System 300 can be part of a lift system. System 300 is configured to provide isolation for electrical surface power measurements and perform condition monitoring in some embodiments. In some embodiments, system 300 provides analog signal acquisition (e.g., voltage and current measurement acquisition). System 300 can be part of a Powerdaq and/or HCC2 controller manufactured by Sensia LLC in some embodiments. The HCC2 controller can include analog acquisition hardware and software.

Electrical drive 302 is any type of power source for powering components associated with system 300. Electrical drive 302 can be a high voltage drive. In some embodiments, drive 302 provides two or three phase alternating current (AC) power on a cable 322 (e.g., two or more conductor cable). Cable 322 can be coupled to motor 308 in some embodiments. An electric drive can refer to a system that utilizes electric power to propel machinery or control various mechanical/electrical processes. Electrical drive 302 can include power electronics, transformers, converters, energy storage, and control systems.

Electrical drive 302 is coupled to a transformer 304. Transformer 304 is optional. Transformer 304 can be a step up or step down transformer. Transformer 304 receives power from drive 302 and transforms the power to a different level on cable 324 which is coupled to motor 308. Cable 324 is similar to cable 322. The power from transformer 304 is three phase alternating current (AC) power in some embodiments. In some embodiments, without a transformer 304, cable 322 is coupled directly or indirectly to motor 308.

Cables 324 and 322 include a shield 312 that is coupled to an earth ground 316 (e.g., a structure coupled to earth, platform, chassis, etc.). An impedance 318 is between earth ground 316 and shield 312 (e.g., armor ground 313). An impedance 319 is between earth ground 316 and a conductor 314 which is coupled to digital ground or DGND 315 in some embodiments. Earth ground 316 is a contact point where conductors coupled to DGND 15 and cables connecting to armor ground 313 are connected in some embodiments. Impedances 318 and 319 generally represent a nominal impedance associated with connections to earth ground 316. Shield 312 isolated from conductor 314 in some embodiments.

Motor 308 is any type of electrical device. Motor 308 can be a solenoid, an inductive motor, an AC motor, a direct current motor, a linear motor, or other device for translating electrical energy into motion or force. In some embodiments, motor 308 is a two or three phase electrical motor. Motor 308 can receive signals with specific voltage levels, waveshapes, and frequencies depending on the system and application. In some embodiments, the voltage signals are sinusoidal signals at 208 volts, 230 volts, 460 volts, and/or 575 volts. The selection of the appropriate voltage depends on factors such as the power requirements of the motor, the type of driven machinery, and the overall electrical infrastructure. Lower voltage systems, such as 208V and 230V systems, are often suitable for smaller motors and applications with moderate power demands, while higher voltage levels like 460V and 575V are employed for larger motors.

Current sensor system 306 includes one or more sensors configured to sense current provided through cable 324 or cable 322. In some embodiments, current sensor system 306 includes three current isolation sensors for measuring currents $I_A$, $I_B$, and $I_C$ associated with motor 308 in some embodiments. The current isolation sensors are current transformer (CT) sensors that include a primary and a secondary to isolate signals in some embodiments. Other types of sensors can be utilized for current sensor system 306. Sensor signals indicative of the currents $I_A$, $I_B$, and $I_C$ are provided to data acquisition system 310, where currents $I_A$, $I_B$, and $I_C$ represent three phases of motor current in some embodiments.

Current isolation sensors refer to any device that provides signals related to measurements of frequency and/or amplitude with isolation in some embodiments. Current sensor system 306 measures and monitors current flow without direct electrical contact between the sensing element and the conductor carrying the current in some embodiments. The isolation can be achieved through various technologies such as magnetic coupling or optical isolation.

Data acquisition system 310 is configured to provide insulation or isolation for circuitry associated with capturing parameters in the environment of system 300. Data acquisition system 310 includes circuitry for providing isolation and circuitry for receiving and or processing measurements. The circuitry associated with digitally processing measurements uses voltages referenced to digital ground (DGND) 315 provided using conductor 314 some embodiments. Circuitry associated with receiving measurements uses voltages referenced to armor ground 313 in some embodiments. Data acquisition system 310 can include or be coupled to computing devices (e.g., an edge controller) for processing the measurements and providing analysis and control and can include or be coupled to communication devices for communicating with users, the cloud, networks, or other servers. Data acquisition system 310 can be a digital system powered by an isolated power supply in some embodiments.

In some embodiments, data acquisition system 310 is configured to monitor electrical surface power quality which can be an important task in oilfield applications. Measurements by data acquisition system 310 can be used to ascertain grid power quality and the integrity of the equipment. For example, the electrical load measurements associated with operations of motor 308 can provide valuable information of the overall system (e.g., the health and operational conditions of motors and pumps). Data acquisition system 310 provides high frequency (e.g., greater than 5 khz) acquisition of all motor phase voltages and currents. Generally, independent of the drive type of drive 302, the sensors need to withstand 5000 volt root mean square (Vrms) phase to phase voltage. Data acquisition system 310 provides acquisition on the high voltage side with digital isolation without sacrificing performance or reduction of scope in some embodiments.

Three phase voltage signals $V_A$, $V_B$, and $V_C$ represent three phases of voltage provided to motor 308 (e.g., three motor phases via cables 324 and/or 322) in some embodiments. In some embodiments, the measurements are floating relative to earth ground 316. The phase voltage relative to shield 312 (e.g., armor ground 313) is implicitely defined by the parasitic capacitances and leakage between phase voltage signals and shield 312. With symmetrical motor, cable and other optional equipment, the phase voltages are symmetrical to armor ground 313 associated with shield 312. The shield 312 acts as a shield or isolator and is on at the potential of armor ground 313. The potential of DGND 315 does not have to be completely isolated, and DGND 315 and armor ground 313 can share a reference point (e.g., earth ground 316) in some embodiments. Apart from negligible impedances 318 (e.g., Z1_earth) and 319 (Z2_earth), the digital isolated low voltage of the edge controller (referenced to DGND potential) associated with data acquisition system 310 and the drive or transformer housing (referenced to armor ground 313) are coupled to earth ground 316 in some embodiments. Isolation by data acquisition system 310 prevents a direct return current path from the high voltage phase voltage signals $V_A$, $V_B$, and $V_C$ through the conductor 314 (DGND 315) back to earth ground 316. A high voltage isolator circuit separate or part of data acquisition system 310 can provide the isolation.

Various sensors can be provided as part of system 200. The sensors can be connected to or part of data acquisition system 310 in some embodiments. Current, voltage, speed, torque, pressure, power, position, frequency, and load sensors can be provided in some embodiments. For example, position sensors can include an inclinometer, proximity switches (e.g., Hall Effect sensors), etc., and load sensors can include load cells, current sensors, and a beam transducer, etc. Such sensors can be operatively coupled to a controller (e.g., via wire and/or wirelessly through wireless circuitry). As an example, a load cell can be a load-capable dynamometer attached to the polished rod for acquiring dynamic data, which may be transmitted and/or otherwise accessed by one or more pieces of equipment. The controller can utilize sensor data to calculate rod loading (e.g., a surface condition) and, coupled with various models (e.g., algorithms), to estimate downhole pump fill (e.g., a downhole condition). Sensed parameters allow various conditions to be diagnosed including but not limited to gas interference, liquid fluid pound severity and gas interference, system leaks, stuck pumps, parted rods and various other anomalies or operating conditions using a dynamometer. The systems and methods described herein may provide an advantageous solution for providing isolation and increased accuracy of monitored variables for one-dimensional, two-dimensional and/or three-dimensional models of the Gibbs wave equation System 300 can implement one or more offline techniques and/or online or live techniques to control equipment at well site 10 in response to the monitored parameters. System 300 may be configured to estimate or predict values of variables that are relatively more difficult to measure such as gas content, intake pressure, damping, and the like. It should be understood that these particular variables are presented as an example and should not be understood as limiting.

Figure 4:
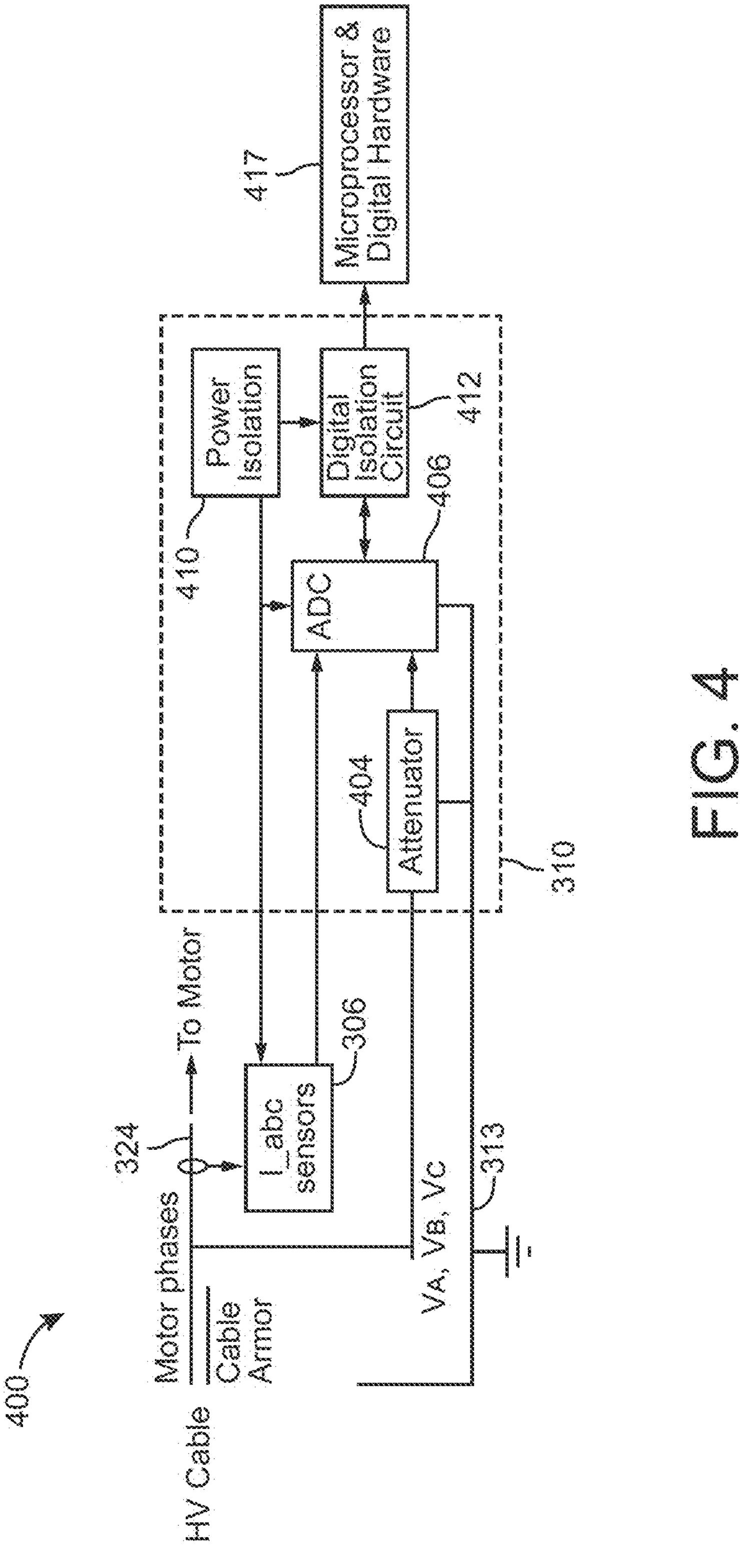
FIG. 4 is a more detailed schematic diagram of the isolation system illustrated in FIG. 3, according to some embodiments.

With reference to FIG. 4, a portion 400 of system 300 (FIG. 3) includes data acquisition system 310 coupled to controller 417. Controller 417 includes digital hardware and a microprocessor or other computing device. Controller 417 can be an edge controller coupled to DGND potential and can be part of or separate from data acquisition system 310.

Data acquisition system 310 includes an attenuator circuit or attenuator 404, an analog to digital converter 406, a power isolation circuit 412, and a power isolation circuit 410. Attenuator 404, power isolation circuit 410, power isolation circuit 412, and converter 406 use voltages referenced to armor ground 313 in some embodiments. Controller 417, power isolation circuit 410 and power isolation circuit 412 use voltages referenced to DGND 315 (FIG. 3) in some embodiments Cable 322 or 324 receive one or more of high voltage phase voltage signals $V_A$, $V_B$, and $V_C$. Power isolation circuit 410 provides power to current sensor system 306, power isolation circuit 412 and converter 406. Power isolation circuit 412 is coupled between controller 417 and converter 406. Converter 406 converts analog current sense signals from current sensor system 306 to current sense signals in digital form. The current sense signals in digital form are provided through power isolation circuit 412 to controller 417. The current measurements are made with complete high voltage isolation in some embodiments. Power isolation circuit 412 can be an optical isolation circuit in some embodiments.

In some embodiments, attenuator 404 reduces the peak voltage isolation requirements. Attenuator 404 can be any circuit for reducing amplitude of voltage associated with one or more of high voltage phase voltage signals $V_A$, $V_B$, and $V_C$. Attenuator 404 can include an impedance network in some embodiments. Attenuator 404 prevents exposure to higher voltages due to a single point failure of power insulation in some embodiments. For example, when a single dead short to shield 312 (FIG. 3) of a phase wire occurs, the phase voltage is brought to armor potential or armor ground 313. In some embodiments, motor 308 alone without any optional integrated local downhole motor low voltage measurements can still operate because the phase to phase voltages stay the same even though the phase voltage potential relative to earth ground 316 (FIG. 3) changes.

Figure 5:
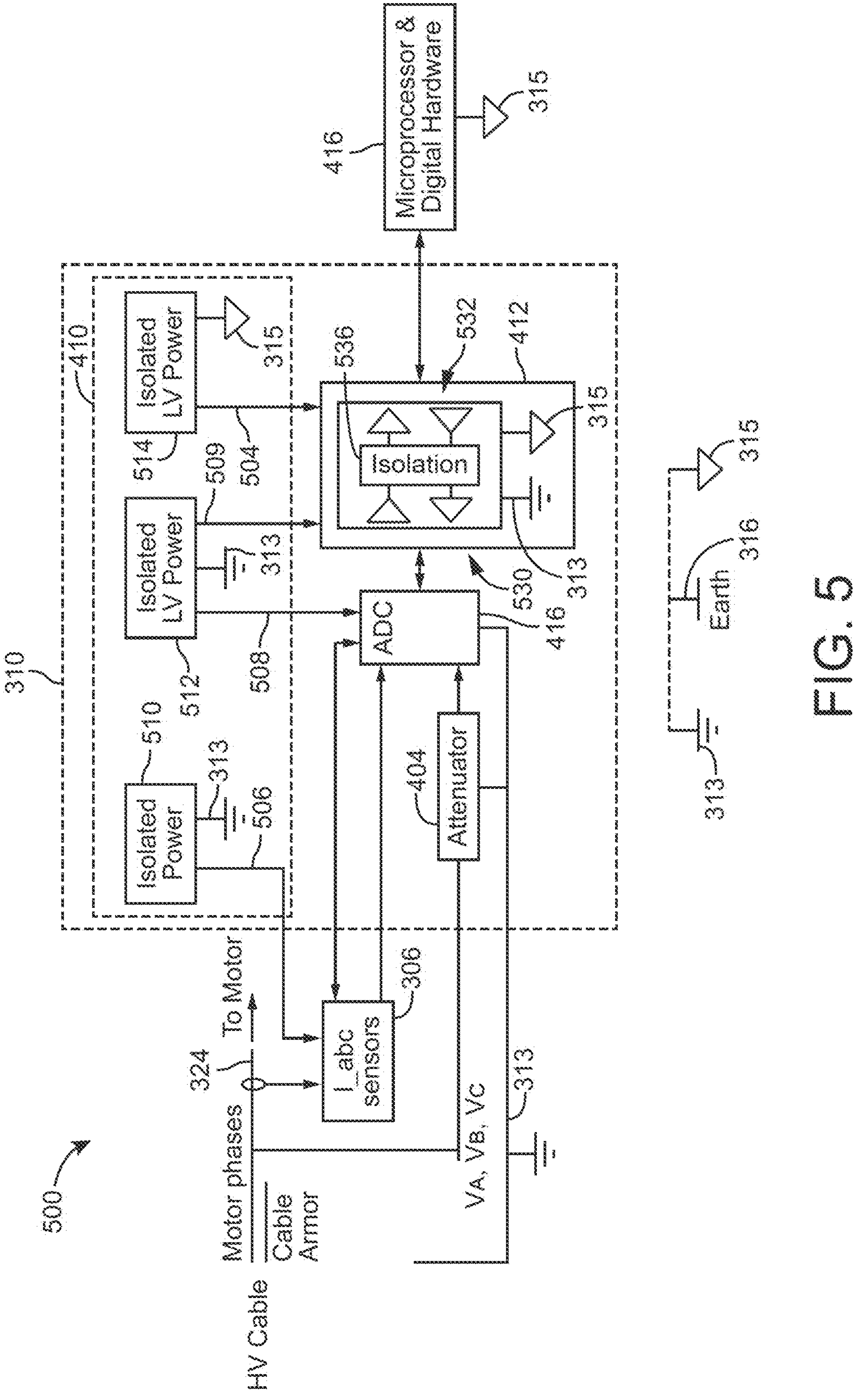
FIG. 5 is a more detailed schematic diagram of the isolation system illustrated in FIG. 3, according to some embodiments.

With reference to FIG. 5, data acquisition unit or system 310 can be provided in a module. Data acquisition system 310 includes converter 416, power isolation circuit 410, attenuator 404, and isolation circuit 412. Isolation circuit 412 includes a first side 530 for receivers and transmitters and other circuitry referenced to armor ground 313 (floating relative to drive 302 (FIG. 3)) and a second side 532 for receivers and transmitters and other circuitry referenced to DGND 315. An isolation circuit 536 (e.g., optical or magnetic coupling type isolation device) separates the first side 530 from the second side 532. High voltage and current is blocked from going from the first side 530 to the second side 532.

Power isolation circuit 410 includes an isolated AC-DC power supply 510, an isolated low voltage power supply 512, and an isolated low voltage power supply 514. Isolated AC-DC power supply 510 provides power (e.g., 12 VDC, 5 VDC, etc.) on conductor 506 referenced to armor ground 313 for sensor system 306, and isolated low voltage power supply 512 provides power on conductors 508 and 509 (e.g., 12 VDC, 5 VDC, etc.) referenced to armor ground 313 for converter 416 and side 530 of isolation circuit 412. Isolated low voltage power supply 514 provides power (e.g., 12 VDC, 5 VDC, etc.) on conductor 516 referenced DGND for side 532 of isolation circuit 412 and controller 417.

Attenuator 404 includes resistors or other impedance elements, and an amplifier. Attenuator 404 provides phase voltage sense signals from the amplifier as differential signals. The resistors and amplifier (e.g., an operational amplifier) are disposed close to side 530 of isolation circuit 412 in some embodiments. The resistors in attenuator 404 serve to reduce the voltage associated with the high voltage phase voltage signals $V_A$, $V_B$, and $V_C$. Converter 416 runs on high voltage potential referenced to armor ground 313 without such potential crossing isolation circuit 412 to second side 532.

In some embodiments, voltage isolation can be achieved by an analog isolation amplifier with converter 416 on low voltage potential eliminating the need of digital isolation of the ADC or with converter 416 on armor ground 313 followed by isolation of the ADC digital interface that connects to controller 417 and digital hardware. Isolation circuit 412 can provide the digital isolation. Analog isolation amplifiers, however, perform worse in almost all performance aspects, gain accuracy, drift, frequency response and noise. The controller can be used in an EDGE controller context, but is also universal usable for other applications to a certain degree.

In some embodiments, current and voltage measurements are synchronized. The current and voltage measurements can be synchronized by using converter 416 with simultaneous multichannel acquisition. Therefore, even though current sensor system 306 could also directly connect to the low voltage DGND potential, the isolated current sensor signals are acquired using armor ground 313. Armor ground 313 is coupled to earth ground 316 as a reference point and DGND 315 is coupled to earth ground 316 as a reference point in some embodiments. Earth ground 316 does no carry any current in some embodiments. In some embodiments, the converter 416 is a pair of converters, one for current sense signals and one for voltage sense signals. Both converters are referenced to armor ground 313.

Configuration of Exemplary Embodiments

As utilized herein, the terms “approximately,” “about,” “substantially”, and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term “exemplary” and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term “coupled” and variations thereof, as used herein, means the joining of two members directly or indirectly to one another. Such joining may be stationary (i.e., permanent or fixed) or moveable (i.e., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If “coupled” or variations thereof are modified by an additional term (i.e., directly coupled), the generic definition of “coupled” provided above is modified by the plain language meaning of the additional term (i.e., “directly coupled” means the joining of two members without any separate intervening member), resulting in a narrower definition than the generic definition of “coupled” provided above. Such coupling may be mechanical, electrical, or fluidic.

The term “or,” as used herein, is used in its inclusive sense (and not in its exclusive sense) so that when used to connect a list of elements, the term “or” means one, some, or all of the elements in the list. Conjunctive language such as the phrase “at least one of X, Y, and Z,” unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (i.e., “top,” “bottom,” “above,” “below”) are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure.

It is important to note that the construction and arrangement of the apparatus as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A pump system for a well site, the pump system comprising:

a data acquisition unit configured to receive current sense signals associated with a motor and phase voltage sense signals associated with the motor, the data acquisition unit comprising an isolation circuit having a first side referenced to a first ground and a second side coupled to an attenuator circuit referenced to a second ground, wherein the first ground is isolated from the second ground, wherein phase voltage signals are provided to the attenuator circuit and wherein the attenuator circuit provides phase voltage sense signals;

wherein the attenuator circuit comprises an impedance network and the phase voltage signals are provided to the impedance network, and wherein the attenuator circuit comprises an amplifier coupled to the impedance network, the amplifier coupled to an analog to digital converter.

2. The pump system of claim 1, further comprising an isolated power source referenced to the first ground and configured to provide first power to the first side.

3. The pump system of claim 2, further comprising a first power source referenced to the second ground and configured to provide power to the second side.

4. The pump system of claim 1, further comprising a first power source referenced to the second ground and configured to provide power to the second side.

5. The pump system of claim 1, wherein the isolation circuit is disposed between a controller and the analog to digital converter.

6. The pump system of claim 1, further comprising:

current sensors configured to provide the current sense signals, the current sensors being referenced to the second ground.

7. A digital acquisition unit for high voltage applications, comprising:

a first analog to digital converter configured to receive current sense signals associated with phase voltage signals and coupled to a first ground;

a second analog to digital converter configured to receive voltage sense signals related to the phase voltage signals and being coupled to the first ground; and an attenuator circuit coupled to the first ground, wherein the first ground is isolated from a second ground, wherein the phase voltage signals are provided to the attenuator circuit and wherein the attenuator circuit provides phase voltage sense signals to the first analog to digital converter; and an isolation circuit having a first side referenced to the first ground and a second side referenced to the second ground, wherein the second side is coupled to the first analog to digital converter and the second analog to digital converter.

8. The digital acquisition unit of claim 7, further comprising an isolated power source coupled to the first ground and configured to provide first power to the first analog to digital converter.

9. The digital acquisition unit of claim 8, a first power source coupled to the second ground and configured to provide power to the second side.

10. The digital acquisition unit of claim 7, wherein the first and second ground are coupled to an earth ground.

11. The digital acquisition unit of claim 10, wherein the attenuator circuit comprises an amplifier coupled to an impedance network, where the amplifier is coupled to the second analog to digital converter.

12. The digital acquisition unit of claim 7, wherein the attenuator circuit comprises an impedance network and the phase voltage signals are provided to the impedance network.

13. The digital acquisition unit of claim 7, further comprising:

current sensors configured to provide the current sense signals.

14. A method of providing measurements to a controller, the method comprising:

receiving current sense signals associated with a motor by a data acquisition unit;

receiving phase voltage sense signals associated with phase voltage signals for the motor by the data acquisition unit, the data acquisition unit comprising a module coupled to a first ground and an attenuator circuit coupled to a second ground, wherein the first ground is isolated from the second ground, wherein the phase voltage signals are provided to the attenuator circuit and wherein the attenuator circuit provides the phase voltage sense signals to the module; and powering an analog to digital converter coupled to receive the phase voltage sense signals using a first power source coupled to the second ground and configured to provide second power to the analog to digital converter.

15. The method of claim 14, further comprising:

powering the module using an isolated power source coupled to the first ground and configured to provide first power to the module.

16. The method of claim 15, further comprising:

powering an analog to digital converter coupled to receive the phase voltage sense signals using a first power source coupled to the second ground and configured to provide second power to the analog to digital converter.

17. The method of claim 14, wherein the attenuator circuit comprises an amplifier coupled to an impedance network, where the amplifier is coupled to an analog to digital converter in the module.

* * * * *